(12) United States Patent
Chan et al.

(10) Patent No.: US 7,068,516 B2
(45) Date of Patent: Jun. 27, 2006

(54) ENCLOSURE WITH PRE-FORMED INTERCHANGEABLE PANELS

(76) Inventors: Eric K. D. Chan, 121Milliken Meadows Drive, Markham, Ontario (CA) L3R 0V7; King Sum Chu, 2A, Block 27, Greenwood Terrace, Sui Wo Road, Fo Tan, Hong Kong (CN)

( * ) Notice: Subject to any disclaimer, the term of this patent is extended or adjusted under 35 U.S.C. 154(b) by 338 days.

(21) Appl. No.: 10/771,095

(22) Filed: Feb. 6, 2004

(65) Prior Publication Data
US 2005/0174723 A1     Aug. 11, 2005

(51) Int. Cl.
*H05K 5/00* (2006.01)
*H05K 5/04* (2006.01)
(52) U.S. Cl. .................. 361/731; 361/752; 361/790; 361/800; 439/677; 439/680
(58) Field of Classification Search ............. 361/731, 361/725, 752, 790, 797, 800, 756, 683–686; 439/501, 638, 677–681
See application file for complete search history.

(56) References Cited

U.S. PATENT DOCUMENTS

| | | | |
|---|---|---|---|
| 6,406,327 B1* | 6/2002 | Soon | 439/501 |
| 6,452,969 B1* | 9/2002 | Yim | 375/240.02 |

* cited by examiner

Primary Examiner—Kamand Cuneo
Assistant Examiner—Hung S. Bui
(74) Attorney, Agent, or Firm—David W. Wong

(57) ABSTRACT

An enclosure for an electronic device has a front opening and rear opening formed by a base casing and a U-shaped cover mounted together thereon. A plurality of modular plates with electrical components pre-mounted thereon are removably and interchangeably mounted at selected positions in the front opening and rear opening of the base casing. The modular plates have an extension bottom leg portion having a shape and configuration with a complementary to those of mounting openings formed in even spacings along the entire length of the edge portion of the base casing. The modular plates also have an upper extension lip engageable with elongated channels formed on an underside edge portion of the front edge and rear edge of the cover.

14 Claims, 8 Drawing Sheets

PRIOR ART

PRIOR ART

US 7,068,516 B2

ENCLOSURE WITH PRE-FORMED INTERCHANGEABLE PANELS

FIELD OF INVENTION

This invention relates to an enclosure for an electronic device and particularly relates to such enclosure having side and top panels consisting of pre-configured interchangeable modular plates.

BACKGROUND OF THE INVENTION

In electronic device development, particularly the device developed by students and hobbyists for experimental and learning purposes, it is necessary to build a mock-up sample of the device after the electronic circuit has been established. A plastic enclosure is employed for housing and supporting the circuit as well as externally operable electrical components such as switches, potentiometer, display meter, and numerical touch panel, etc., as shown in FIGS. 1 and 5. Such enclosure commonly consists of two mating rectangular casings in which the electronic circuit board is mounted in one casing and the other casing, having side and top panels would serve as a cover which is then mounted over the first casing to form a complete enclosure. Such enclosure is generally relatively small in physical size and yet it is necessary to form openings in its side panels and/or the top panel for mounting the externally operable electrical components. Due to the relatively small physical size of the enclosure, it is difficult to form the required openings because firstly it is difficult to mount the plastic casings securely for cutting the openings; secondly, that the plastic side walls would crack readily when the openings are being formed by cutting or sawing. In order to reduce the risk of cracking while cutting or sawing the opening in a wall panel, it is the common practice that an opening is formed by first marking the outline of the opening in the wall panel, and a series of small holes are then drilled along the marked outline as shown in FIGS. 3 and 7. Finally the remaining outline marking between the neighboring small holes are cut or sawed to form the opening required as shown in FIGS. 4 and 8. Such task of forming an opening in the plastic wall panels is time consuming and awkward to carry out and moreover it still does not eliminate the problem in the difficulty of maintaining the casing securely in place for the drilling and sawing operations; and most of all, the opening thus formed would inherently have an irregular edge, and the shape is only more or less similar to the marked outline. An electrical component may be loosely mounted in such irregular edge opening so that during operation of such loosely mounted electrical component, there may be movement of the electrical component, its electrical connection terminals and its electrical connection wire to cause a potential electrical and/or fire hazard. Moreover, the irregular edge would often be visible after the electrical component has been mounted therein so that it presents an objectionable crude appearance of the device. The irregular edge may be refined with extensive and time consuming filing and trimming; however, after filing and trimming, it often results in an opening larger than the marked outline.

Furthermore, the enclosure may not be re-used for a further project which may have different externally operable electrical components to be mounted on different positions of the side and top panels. Thus, the enclosure is not re-usable.

SUMMARY OF THE INVENTION

It is a principal object of the present invention to provide an enclosure having a plurality of interchangeable modular panels selectable by the user for forming the side panels.

It is another object of the present invention to provide an enclosure having a plurality of interchangeable modular panels removably yet securely mounted therein.

It is another object of the present invention to provide an enclosure having variable side panels which may be configured to suit any circuit arrangement.

It is yet another object of the present invention to provide an enclosure having a plurality of interchangeable modular panels with different commonly used externally operable electrical components pre-mounted thereon.

It is still another object of the present invention to provide an enclosure which is re-usable for various electrical circuit development projects.

BRIEF DESCRIPTION OF THE DRAWINGS

The present invention can be more readily understood from the following description taken in conjunction with the accompanying drawings, in which.

DETAILED DESCRIPTION OF THE PREFERRED EMBODIMENTS

Figure 1:
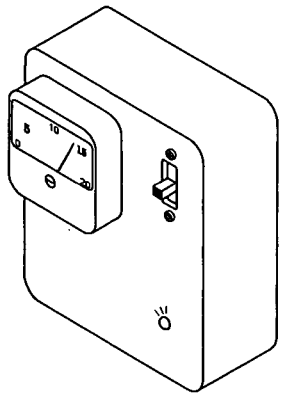
FIG. 1 is an exploded perspective top elevation view of a prior art enclosure consisting of two mating casings with electrical components mounted in openings formed in the top casing.
Figure 3:
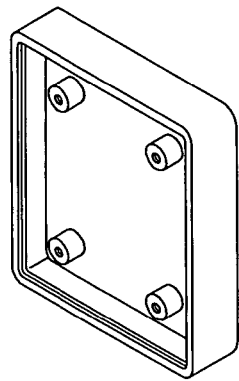
FIG. 3 is an enlarged isolated elevation view of the series of small holes formed along the outline of the circular opening of FIG. 2.
Figure 3:
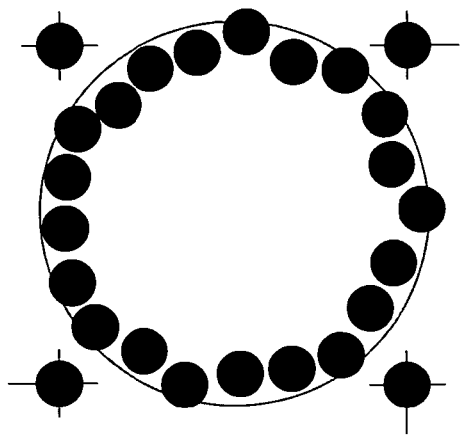
Figure 2:
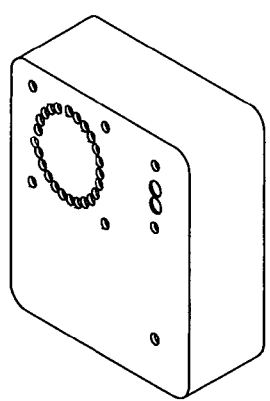
FIG. 2 another exploded perspective top elevation view of the prior art enclosure showing the drilling of a series of small holes along the marked outline of openings in the enclosure of FIG. 1 for mounting various externally operable electrical components.
Figure 2:
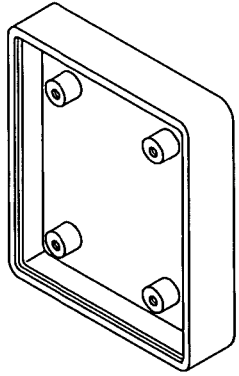
Figure 4:
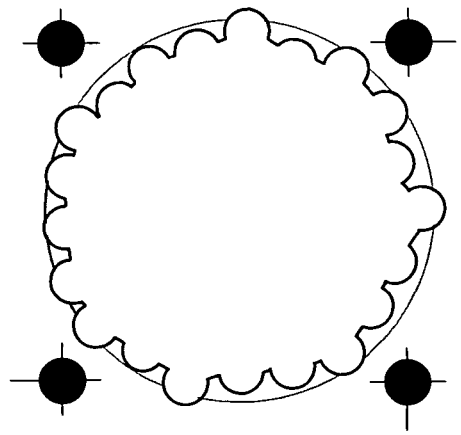
FIG. 4 is an enlarged isolated elevation view of the circular opening with an irregular edge formed by cutting or sawing the remaining marked outline of the circular opening of FIG. 2.
Figure 5:
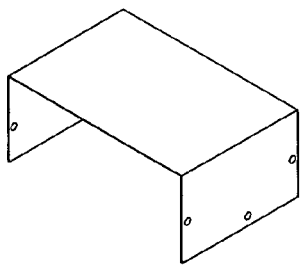
FIG. 5 is an exploded perspective top elevation view of another prior art enclosure having externally operable electrical components mounted on its side panels.
Figure 5:
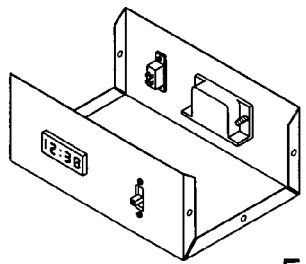
Figure 6:
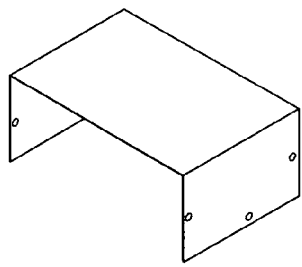
FIG. 6 is an exploded perspective top elevation view of the enclosure of FIG. 5 with small holes drilled along the marked outline of the required openings for mounting the externally operable electrical components.
Figure 6:
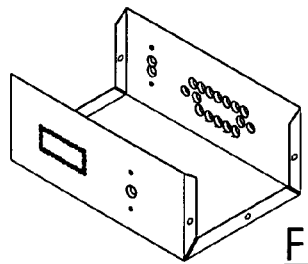
Figure 7:
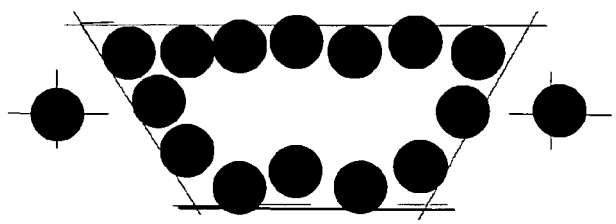
FIG. 7 is an enlarged isolated elevation view of a series of small holes formed along the marked outline of the trapezoidal opening of the side panel of FIG. 6.
Figure 8:
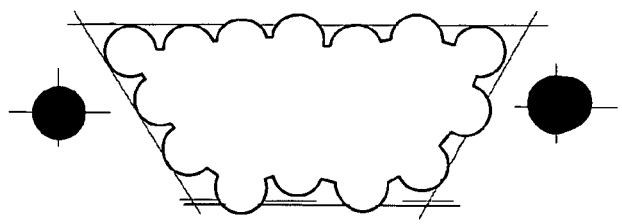
FIG. 8 is an enlarged isolated elevation view of the trapezoidal opening with an irregular edge formed by cutting or sawing the remaining marked outline of the trapezoidal opening of FIG. 7.
Figure 9:
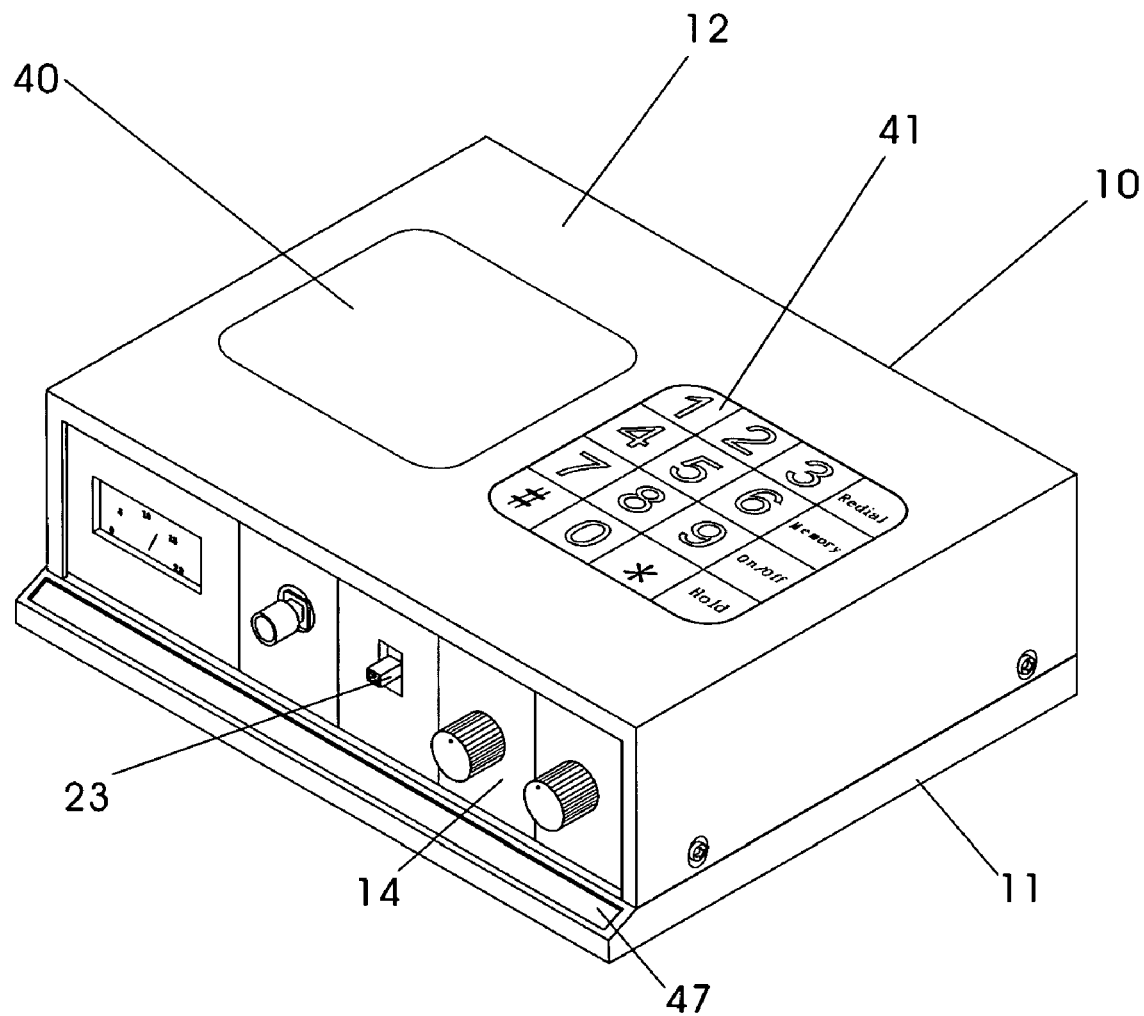
FIG. 9 is a perspective top elevation view of the enclosure according to the present invention having pre-configured interchangeable modular side and top panels.
Figure 10:
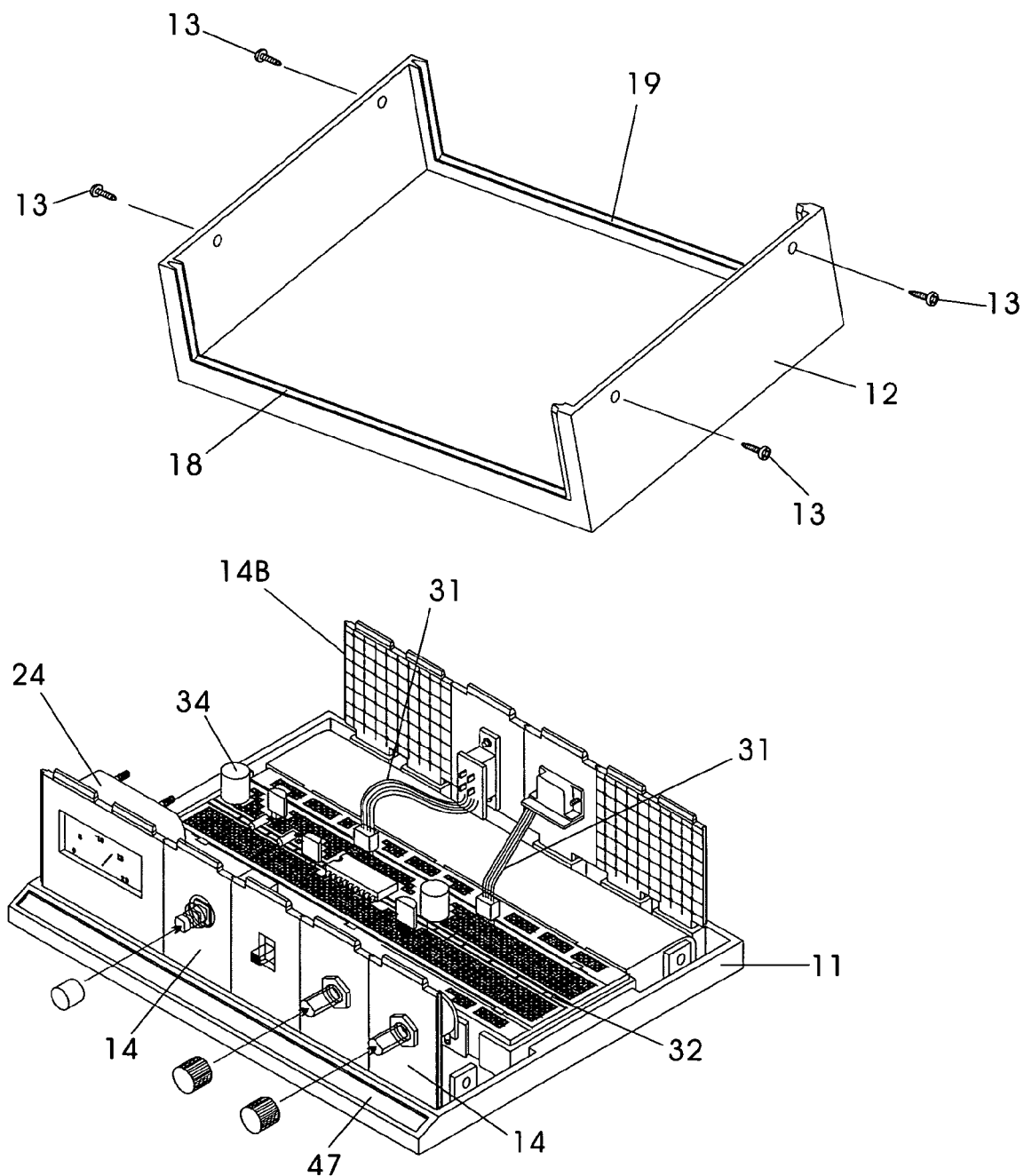
FIG. 10 is an exploded top perspective elevation view of the enclosure of the present invention with the U-shaped cover portion shown in the upside down position.
Figure 11:
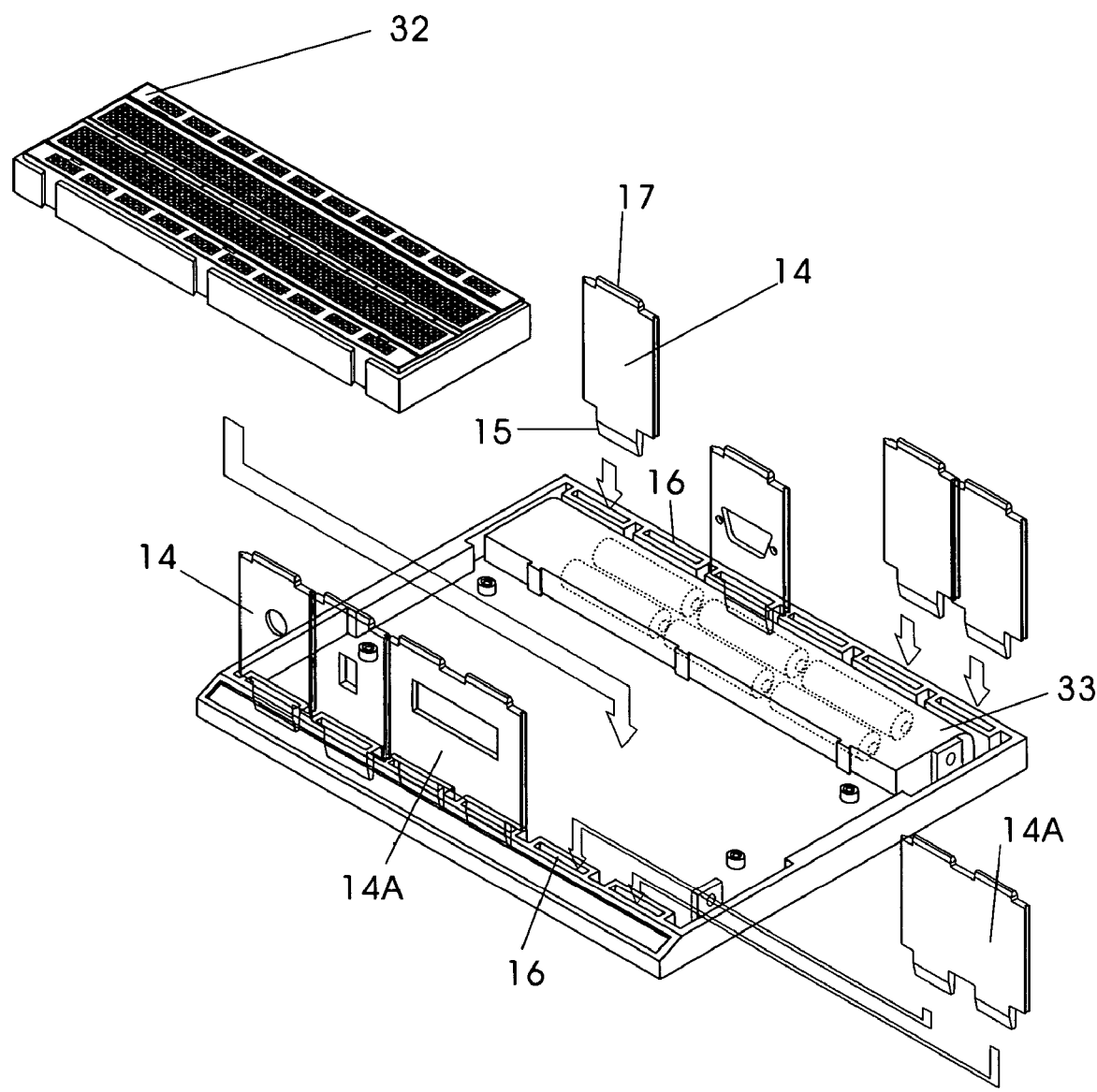
FIG. 11 is an exploded top perspective elevation view of the base casing showing the mounting of a circuit building breadboard and the pre-configured interchangeable modular plates removably mounted on its front and rear sides.
Figure 12:
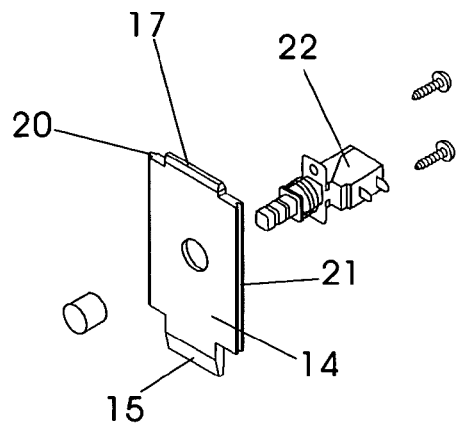
FIGS. 12 through 17 are perspective elevation view of the interchangeable modular panels having pre-formed open
Figure 13:
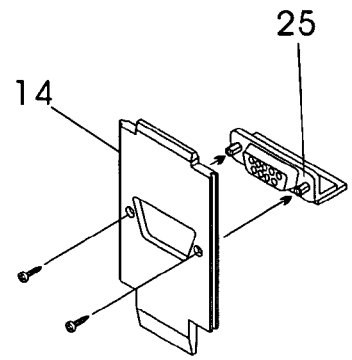
Figure 14:
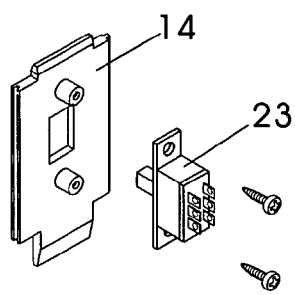
Figure 15:
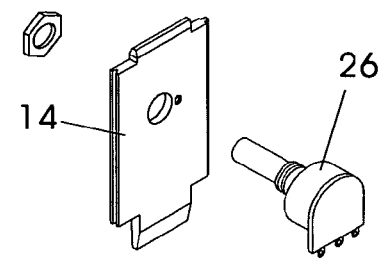
Figure 16:
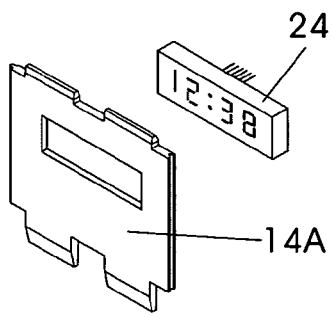
Figure 17:
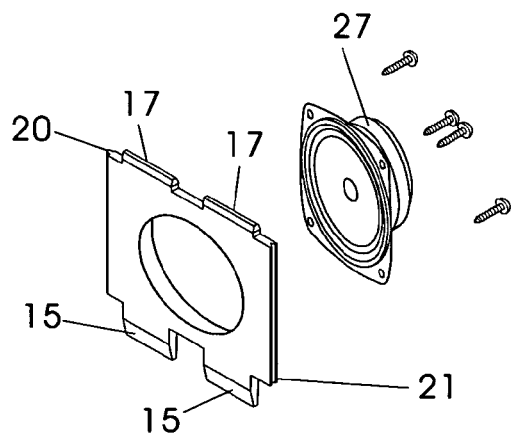
Figure 18:
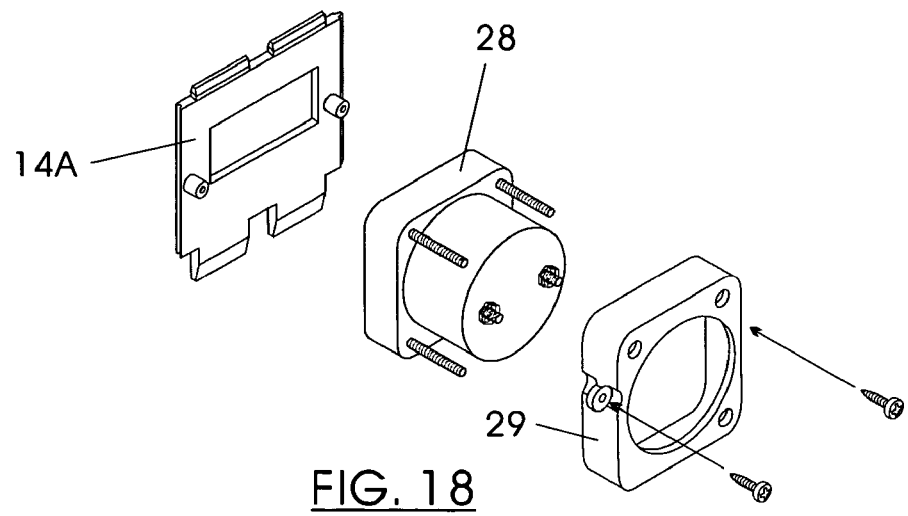
- FIG. 18 is an exploded perspective elevation view of an externally operable electrical component provided with an adaptor for mounting to an interchangeable modular plate.
Figure 19:
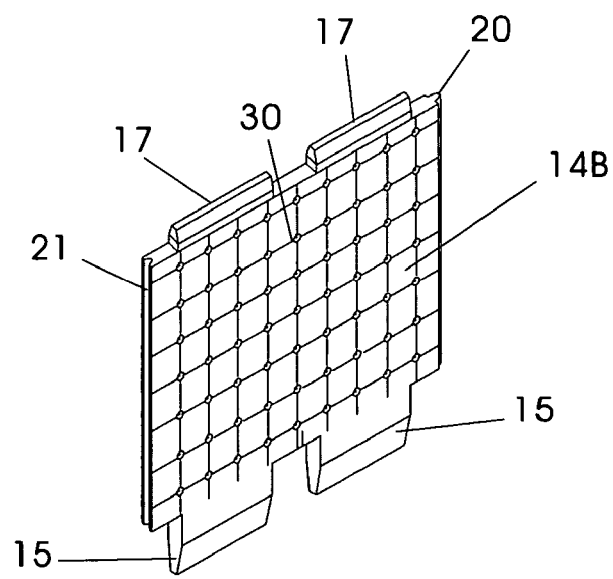
FIG. 19 is a perspective elevation view of an interchangeable modular plate having a grid marking provided thereon to facilitate marking and forming of a customized opening therein.
Figure 20:
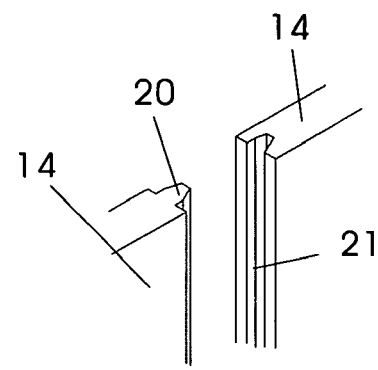
FIG. 20 is an enlarged isolated elevation view of the tongue and groove edges provided at the side edges of the modular plates for joining and securing them fixedly together.

With reference to the drawings in which the same reference numerals designate like parts in the several views, the enclosure 10 of the present invention, for an electronic device development, includes a base casing 11 and a top cover 12. The top cover 12 is generally U-shaped having opened front and rear sides and is placeable over the base casing 11 and mounted thereon by screws 13 or alternatively with snap fitting edge configurations. A plurality of interchangeable modular plates 14 are mountable in the enclosure to close its opened front and rear sides. The modular plate 14 has a lower extension leg 15 which is operable for inserting into a similarly and complementarily shaped mounting opening 16 formed in even spacing along the entire length of the front and rear edge portions of the base casing 11. In the exemplary embodiment shown, the extension leg 15 is rectangular in shape and the mounting opening 16 has a complementary rectangular shape such that a modular plate 14 removably secured to the base casing 11 by inserting its extension leg 15 into a selected mounting opening 16. A plurality the mounting openings 16 are formed in even spacing along the entire length of the opposite front and rear side edge portions of the base casing 11, so that the modular plates 14 are interchangeably mounted in a side-by-side manner in the front and rear sides of the enclosure in any selected positions. It can be appreciated that the shape of the extension leg 15 and that of the mounting opening 16 may have other complementary shape than the rectangular shape as shown in the example herein. For example, posts and openings having complementary shape and configuration may be formed on either the lower edge of the modular panel or the edge portion of the base casing to provide the same function. The modular plates 14 have either the same unit width or multiple of the unit width. A large modular plate, such as a double size modular plate 14A having two unit width is provided with two extension legs such that the two legs are insertable into two adjoining mounting openings 16 for securing it in place. Similarly, larger modular plates having a multiple unit width may be provided with a plurality of extension legs for mounting to a plurality of neighboring mounting openings 16 of the base casing 11. An upper extension lip 17 is also provided at the upper edge of the modular plate 14. The upper extension lip 17 will engage with elongated channels 18 and 19 formed in the entire length of the opposite front and rear edge portions of the top cover 12 when the top cover 12 is placed and mounted over the base casing 11 so that the modular plates 14 will be firmly sandwiched in place between the top cover and the base casing. Each modular plate 14 is provided with a tongued vertical side edge 20 and an opposite mating grooved vertical side edge 21 as best shown in FIG. 20 such that neighboring modular plates 16 may be joined and latched together by engaging the tongued vertical side edge 20 of one modular plate with the grooved vertical side edge 21 of the neighboring modular plate together.

As best shown in FIGS. 12 through 17, the modular plates 14 have pre-formed precise openings with commonly used externally operable electrical components such as switches 22 and 23, a numerical display 24, a terminal connector 25, an adjustable potentiometer 26, and a speaker 27 safely mounted thereon. Some externally accessible electrical components such as a moving coil meter 28 may be mounted to the modular plate 14 with an adaptor hood 29. The user simply selects from such modular plates with the required externally operable electrical components already mounted thereon and blank modular plates to form the side panels of the enclosure 10 with the externally operable electrical components located at the selected positions. Blank modular plates 14B are also provided which may have a grid marking 30 formed thereon to facilitate the user to form a customized opening therein, if required, for mounting an uncommon electrical component.

The electrical components mounted on the modular side plates 14 are provided with pre-formed electrical connecting wires 31. The advantage of such provision will become apparent in the following description.

An electrical building breadboard 32 is mountable in the base casing 11 and a battery well 33 may also be conveniently provided therein. In the circuit development mock up sample, electrical components 34, such as IC chips, resistors, capacitors, and transistors etc., are mounted on the breadboard 32 and are interconnected with their lead wires inserted into selected connection openings of the breadboard as in common practice. The electrical connecting wires 31 of the electrical components mounted on the modular side plates 14 may then be conveniently inserted into the required connection openings of the breadboard to connect to the electrical components mounted on the breadboard to form the required circuit. The pre-formed connection wires 31 ensures that the electrical connections to the externally operable electrical components are well formed and secured.

Figure 21:
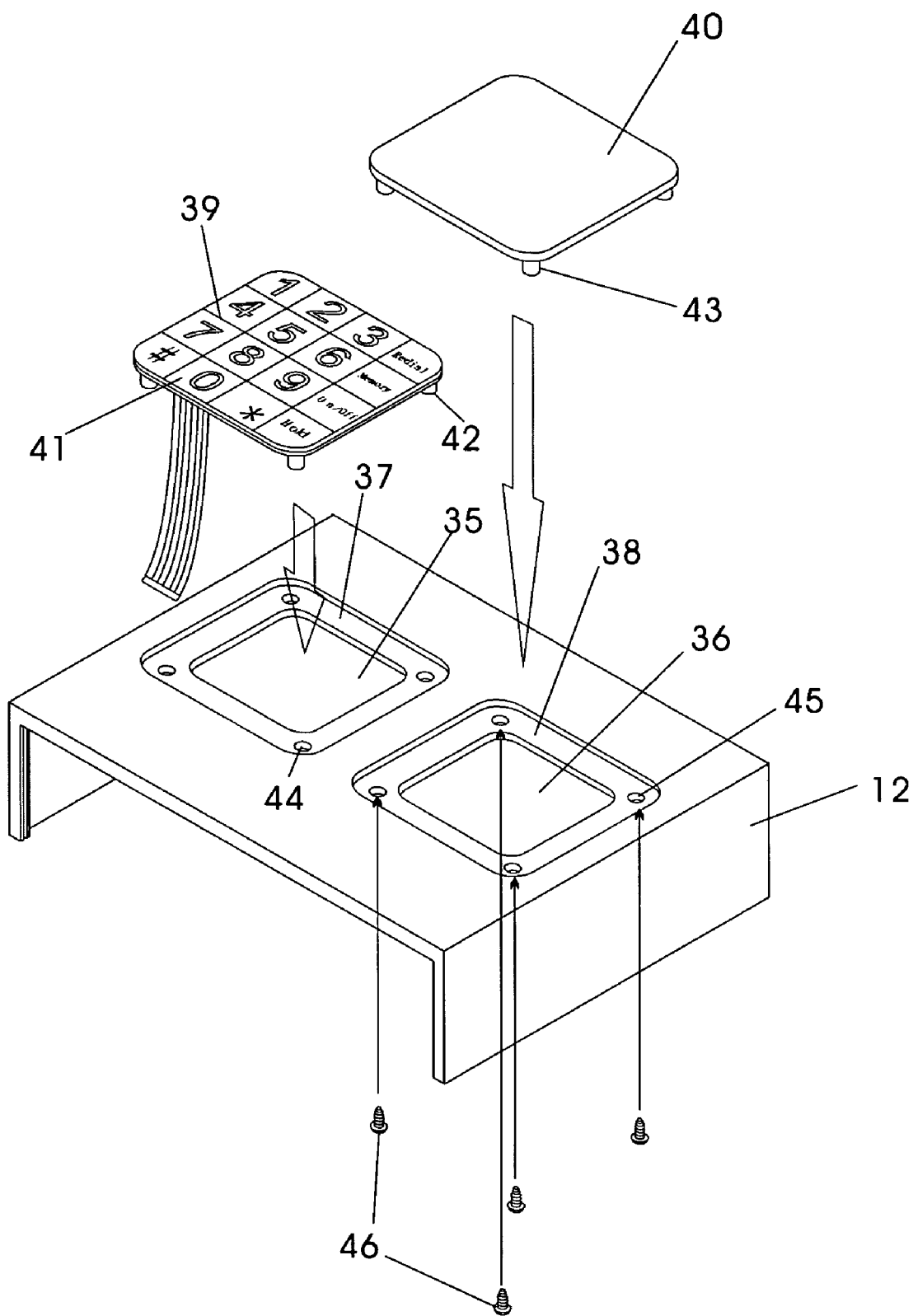
FIG. 21 is an exploded top elevation view of the top cover casing showing the mounting of the modular top plates thereon.

Openings 35 and 36 having a similar shape may also be provided in the top cover casing 12. The opening 35 has a recessed shoulder 37, and similarly the opening 36 has a recessed shoulder 38. Modular top plates 39 and 40 having a similar shape as the openings 35 and 36 may be mounted in these openings and supported in place by the recessed shoulders 37 and 38 respectively. As best shown in FIG. 21, the modular top plates may be used for providing a numerical touch panel or display 41 or other similar components. If no component is required, the opening may be covered with a blank plate 40 as shown in FIG. 21. The modular top plates 39 and 40 are secured to the top cover casing 12 with downwardly extending sleeves 42 and 43 which may be snap-fitted with openings 44 and 45 provided in the shoulders 37 and 38. The modular top plates 39 and 40 may additionally be secured in place in the openings 35 and 36 with screws 46 engaging a threaded opening formed in the sleeves 42 and 43.

Since the modular plates 14 are interchangeable and may be positioned in any selected position along the edge portions of the base casing 11, the enclosure 10 may be easily and readily re-used for various circuit development projects if required.

A slanted platform 47 extending forwardly and downwardly from the front edge of the base casing 11 is provided. The platform 47 facilitates the provision of labels or markings thereon for indicating the operation of the externally operable electrical components mounted on the modular plates 14.

While preferred exemplary embodiments of the invention have been illustrated and described, although not by way of limitation, it will be obvious to those skilled in the art that many alternatives, changes, variations and modifications can be made without departing from the spirit and scope of the invention and without sacrificing any of its advantages, and it is intended to cover in the appended claims all such alternatives, changes, variations and modifications that are within the spirit and scope of this invention.

What we claim is:

1. An enclosure for an electronic device comprising,
 a generally rectangular base casing having an elongated front edge and an elongated rear edge,
 a generally U-shaped cover adapted for mounting over said base casing for forming an enclosure, said cover having a front edge aligned with said front edge of said base casing and forming a front opening therewith, and cover having a rear edge aligned with said rear edge of said base casing and forming a rear opening therewith,
 a plurality of mounting openings formed in an evenly spaced manner along said front edge and said rear edge of said base casing, all of said mounting openings having an identical predetermined shape,
 a plurality of interchangeable modular plates removably mounted along said front edge and said rear edge of said base casing, all of said modular plates having a bottom extension leg portion having a complementary shape of said predetermined shape of said mounting openings and adapted to be interchangeably inserted into selected mounting openings for mounting to said base casing.

2. An enclosure according to claim 1 wherein said modular plates have an extension upper lip portion extending upwards, and an elongated channel is formed at an underside of said front edge of said cover and adapted to engage with said upper lip portion of said modular plates mounted at said front opening, a second elongated channel is formed at an underside of said rear edge of said cover and adapted to engage with said upper lip portion of said modular plates mounted at said rear opening.

3. An enclosure according to claim 2 wherein said modular plates have a tongue formed at one vertical side edge and a groove formed at an opposite vertical edge, said tongue and said groove having complementary mating shapes whereby said tongue and said groove of neighboring modular plates mounted on said base casing engage and latch with one another.

4. An enclosure according to claim 3 wherein said modular plates have pre-formed openings formed therein adapted for mounting selected electrical components securely thereon.

5. An enclosure according to claim 4 wherein said electrical components mounted on said modular plates are provided with electrical connection wires.

6. An enclosure according to claim 5 including an electrical circuit building breadboard mounted in said base casing adapted to support electrical components of the electrical circuit of said electronic device.

7. An enclosure according to claim 6 including a battery well formed in said base casing adapted for housing batteries for supplying electrical power to the electrical circuit.

8. An enclosure for an electronic device comprising,
 a generally rectangular base casing having an elongated front edge and an elongated rear edge,
 a plurality of rectangular mounting openings formed along an edge portion of both said front edge and said rear edge of said base casing,
 a generally U-shaped cover adapted to cover said base casing, said cover having a front edge aligned with said front edge of said base casing and forming a front opening therewith, and said cover having a rear edge aligned with said rear edge of said base casing and forming a rear opening therewith, said U-shaped cover having a first channel formed in the entire length of an underside edge portion of said front edge therein, and a second channel formed in the entire length of an underside edge portion of said rear edge therein, said first channel being positioned directly above said mounting openings in said front edge of said base casing and said second channel being positioned directly above said mounting openings in said rear edge of said base casing when said cover is mounted over said base casing,
 a plurality of mounting openings formed in an evenly spaced in an edge portion along the entire length of said front edge and said rear edge of said base casing, all of said mounting openings having a predetermined shape and configuration,
 a plurality of modular plates removably and interchangeably mountable in any selected positions in said edge portion of said front edge and said rear edge of said base casing for enclosing said front opening and said rear opening, said modular plates having a bottom leg having a complementary shape and configuration of said predetermined shape and configuration of said mounting openings, said modular plates having an upper extension lip portion engageable with said first channel and said second channel of said cover.

9. An enclosure according to claim 8 wherein each one of said modular plates has an elongated tongue formed in the entire length of a first vertical side edge, and an elongated groove formed in the entire length of a second side edge, said tongue and said groove having complementary mating shapes, and said tongue and said groove of neighboring modular plates being adapted to engage with each other in a latching engagement when said modular plates are mounted on said base casing.

10. An enclosure according to claim 9 including a plurality of selected electrical components pre-mounted on said modular plates, and electrical components having electrical connection wires provided thereon.

11. An enclosure according to claim 10 including an electrical circuit building breadboard mounted in said base casing, and a battery casing located in said base casing adapted to house batteries for supplying electrical power to said device.

12. An enclosure according to claim 11 wherein said extension leg portion and said mounting openings are rectangular in shape.

13. An enclosure according to claim 12 including a plurality of rectangular openings formed in a top panel of said cover, said rectangular openings having recessed shoulder portion, a plurality of modular rectangular plates adapted for mounting in selected rectangular openings interchangeably.

14. An enclosure according to claim 13 including a slanted extension platform portion formed in front of said front edge of said base casing, said platform portion extending forwardly and downwardly from said front edge of said base casing.

* * * * *